United States Patent
Roiz-Wilson

(10) Patent No.: US 12,170,162 B2
(45) Date of Patent: Dec. 17, 2024

(54) WARPED MAGNETIC TUNNEL JUNCTIONS AND BIT-PATTERNED MEDIA

(71) Applicant: Jannier Maximo Roiz-Wilson, Santa Clara, CA (US)

(72) Inventor: Jannier Maximo Roiz-Wilson, Santa Clara, CA (US)

(73) Assignee: Jannier M. Roiz-Wilson

( * ) Notice: Subject to any disclaimer, the term of this patent is extended or adjusted under 35 U.S.C. 154(b) by 0 days.

(21) Appl. No.: 17/114,965

(22) Filed: Dec. 8, 2020

(65) Prior Publication Data

US 2022/0181061 A1 Jun. 9, 2022

(51) Int. Cl.
| | | |
|---|---|---|
| *G11B 5/39* | (2006.01) | |
| *H01F 10/32* | (2006.01) | |
| *H10N 52/80* | (2023.01) | |

(52) U.S. Cl.
CPC ......... *H01F 10/329* (2013.01); *G11B 5/3909* (2013.01); *H01F 10/3254* (2013.01); *H01F 10/3286* (2013.01); *H10N 52/80* (2023.02)

(58) Field of Classification Search
CPC ............... H01F 10/329; H01F 10/3254; H01F 10/3286; G11B 5/3909; H10N 52/80; H10N 50/10; H10N 50/80
See application file for complete search history.

(56) References Cited

U.S. PATENT DOCUMENTS

| | | | | |
|---|---|---|---|---|
| 6,833,573 B1 * | 12/2004 | Worledge | ................ | G11C 11/16 |
| | | | | 257/295 |
| 8,878,319 B2 * | 11/2014 | Choi | ................ | H01L 43/12 |
| | | | | 257/108 |
| 9,748,000 B2 * | 8/2017 | Nagaosa | ................ | G11C 19/085 |
| 9,966,122 B2 * | 5/2018 | Shirotori | ................ | G11C 11/161 |

(Continued)

FOREIGN PATENT DOCUMENTS

| | | | | |
|---|---|---|---|---|
| AU | 2021102996 A4 * | 7/2021 | ........... | G11C 11/161 |
| WO | WO 2015/066469 A1 * | 5/2015 | | |

OTHER PUBLICATIONS

Pylypovskyi et al. "Chiral Skyrmion and Skyrmionium States Engineered by the Gradient of Curvature," Physical Review Applied 10, 064057, Published Dec. 26, 2018. (Year: 2018).*

(Continued)

*Primary Examiner* — William J Klimowicz

(57) ABSTRACT

The present invention comprises Magnetic Tunnel Junctions and Bit-Patterned Media with a warped geometry with the purpose of attaining large thermal stability factors and dramatically increasing the scalability of the magnetic bits while still allowing the reduction of switching current density and switching magnetic field, and also increasing switching speed. The warped shape allows providing thermal stability to the bits through dynamic exchange energy barrier and also by providing additional net magnetic anisotropy through shape-induced reduction of the demagnetization field. The dynamic exchange energy barrier in turn (Continued)

allows engineering the damping torque and the free-layer's magnetic parameters to a much larger extent than the current planar technology. It also allows much faster magnetic-field-induced switching of patterned bits than it is possible with current hard disk drive technology, through the use of precession torque instead of conventional damping torque.

10 Claims, 15 Drawing Sheets

(56) References Cited

U.S. PATENT DOCUMENTS

| | | | | |
|---|---|---|---|---|
| 10,141,068 | B2* | 11/2018 | Nagaosa | G11C 11/1675 |
| 10,777,248 | B1* | 9/2020 | Mihajlovic | H01F 10/329 |
| 11,386,951 | B2* | 7/2022 | O'Brien | H10B 61/22 |
| 11,682,514 | B2* | 6/2023 | Dixit | H01F 10/329 |
| | | | | 257/421 |
| 2004/0188733 | A1* | 9/2004 | Asao | H10B 61/22 |
| | | | | 257/E27.005 |
| 2005/0088905 | A1* | 4/2005 | Worledge | G11C 11/16 |
| | | | | 365/232 |
| 2007/0247901 | A1* | 10/2007 | Akinaga | B82Y 25/00 |
| | | | | 365/173 |
| 2009/0057654 | A1* | 3/2009 | Saito | B82Y 25/00 |
| | | | | 257/E29.323 |
| 2010/0276733 | A1* | 11/2010 | Li | H01L 27/1446 |
| | | | | 257/E29.166 |
| 2010/0290281 | A1* | 11/2010 | Kim | G11C 11/1673 |
| | | | | 365/171 |
| 2013/0015540 | A1* | 1/2013 | Choi | H10N 50/01 |
| | | | | 257/E43.001 |
| 2013/0070367 | A1* | 3/2013 | Igarashi | G11B 5/1278 |
| | | | | 360/75 |
| 2016/0351242 | A1* | 12/2016 | Nagaosa | G11C 11/18 |
| 2017/0018297 | A1* | 1/2017 | Zang | G11C 11/1673 |
| 2017/0033742 | A1* | 2/2017 | Akerman | H03B 15/006 |
| 2017/0053686 | A1* | 2/2017 | Oike | H10N 50/80 |
| 2017/0125665 | A1* | 5/2017 | Yamada | H10B 61/22 |
| 2017/0169898 | A1* | 6/2017 | Nagaosa | G11C 11/16 |
| 2017/0178746 | A1* | 6/2017 | Nagaosa | H10N 50/10 |
| 2017/0256351 | A1* | 9/2017 | Cros | H10N 50/00 |
| 2017/0263329 | A1* | 9/2017 | Quinsat | G11C 19/0833 |
| 2018/0090195 | A1* | 3/2018 | Mochizuki | G11C 11/1675 |
| 2018/0114898 | A1* | 4/2018 | Lee | G11C 11/1659 |
| 2018/0240972 | A1* | 8/2018 | Gilbert | B82Y 25/00 |
| 2019/0131049 | A1* | 5/2019 | Büttner | G11C 11/1675 |
| 2019/0148630 | A1* | 5/2019 | Haq | H10N 50/10 |
| | | | | 257/421 |
| 2019/0288183 | A1* | 9/2019 | Kanaya | H10N 50/80 |
| 2020/0005861 | A1* | 1/2020 | O'Brien | H01F 10/3272 |
| 2020/0006628 | A1* | 1/2020 | O'Brien | H01F 10/3272 |
| 2020/0243751 | A1* | 7/2020 | Liu | G11C 11/1673 |
| 2020/0259074 | A1* | 8/2020 | Fitelson | H10N 50/85 |
| 2021/0193915 | A1* | 6/2021 | Haq | H10N 50/85 |
| 2021/0359000 | A1* | 11/2021 | Dixit | G11C 11/161 |
| 2022/0059754 | A1* | 2/2022 | Dixit | H01F 10/3286 |
| 2022/0181061 | A1* | 6/2022 | Roiz-Wilson | H01F 10/329 |
| 2022/0230669 | A1* | 7/2022 | Buchanan | H10N 50/10 |
| 2022/0384717 | A1* | 12/2022 | Kim | H01F 10/123 |
| 2023/0026375 | A1* | 1/2023 | Klaeui | H01F 10/329 |
| 2023/0107977 | A1* | 4/2023 | Haq | H01F 10/06 |
| | | | | 257/421 |

OTHER PUBLICATIONS

Streubel et al., "Magnetism in Curved Geometries," Journal of Physics D: Applied Physics; Topical Review, published Aug. 17, 2016. (Year: 2016).*

Liu et al., "Magnetic Skyrmions in Curved Geometries," Rare Metals, published Feb. 2, 2022. (Year: 2022).*

* cited by examiner

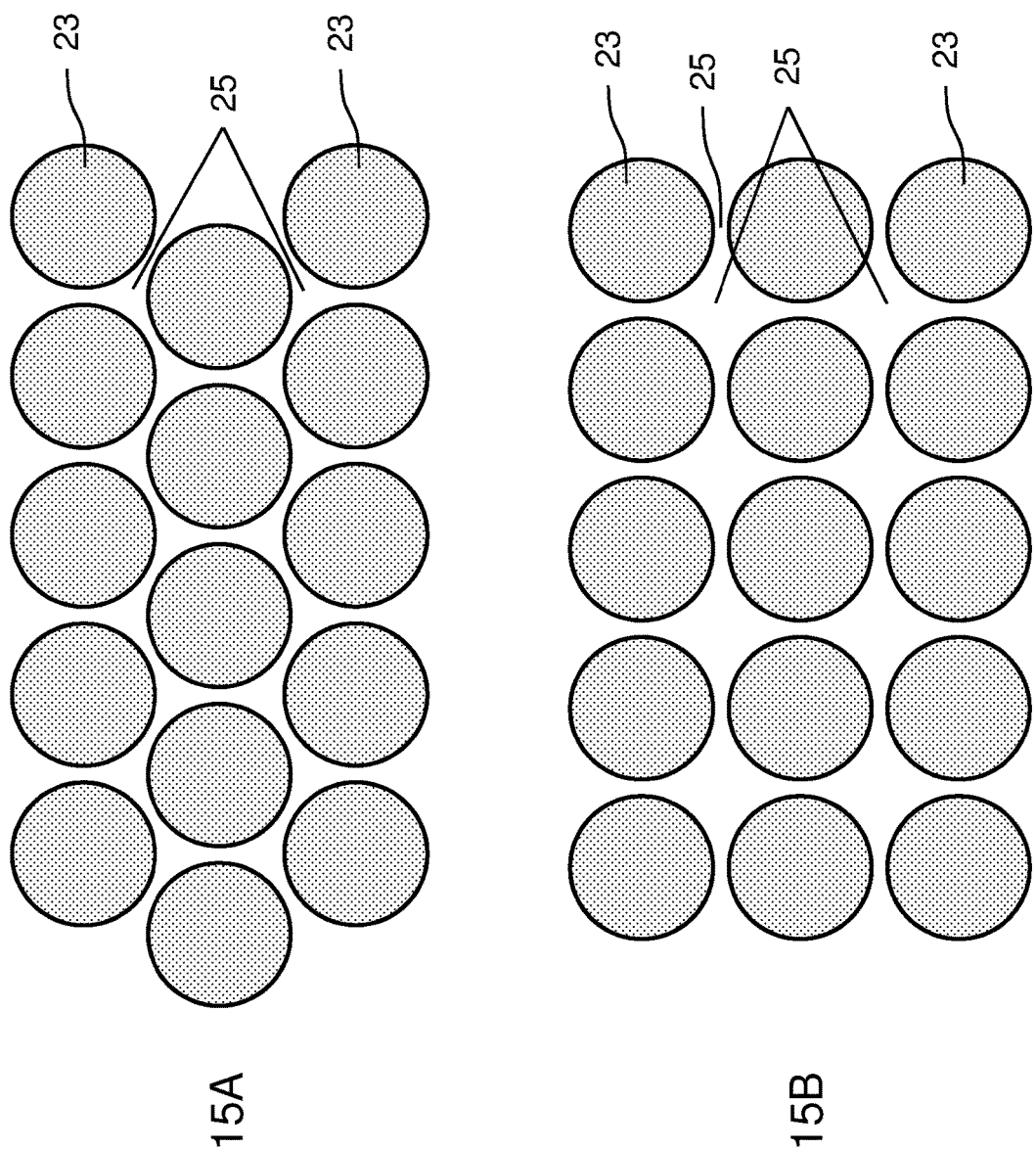

WARPED MAGNETIC TUNNEL JUNCTIONS AND BIT-PATTERNED MEDIA

CROSS-REFERENCE TO RELATED APPLICATIONS

The present application claims the benefit of the provisional application for patent of U.S. No. 62/9742,376.

STATEMENT REGARDING FEDERALLY SPONSORED RESEARCH OR DEVELOPMENT (Not Applicable)

THE NAMES OF THE PARTIES TO A JOINT RESEARCH AGREEMENT (Not Applicable)

INCORPORATION-BY-REFERENCE OF MATERIAL SUBMITTED ON A COMPACT DISC OR AS A TEXT FILE VIA THE OFFICE OF ELECTRONIC FILING SYSTEM (EFS-WEB)

(Not Applicable)

STATEMENT REGARDING PRIOR DISCLOSURES BY THE INVENTOR OR A JOINT

INVENTOR: (Not Applicable)

FIELD OF THE INVENTION

Embodiments of the present invention relate to magnetic tunnel junctions and bit-patterned media that use a warp-shaped free-layer as a way to acquire thermal stability, reduce areal dimensions, reduce switching current or switching field and/or switching time and in general improve the overall functioning of Magnetic Tunnel Junctions and bit-patterned media.

BACKGROUND OF THE INVENTION

Conventionally, perpendicular spin transfer torque (pSTT) magnetic tunnel junctions (MTJs) have relied on planar thin film magnetic layer stack configurations as the material from which carving-out standing MTJ pillars. In the latest embodiments to this approach, the perpendicular magnetization of the free-layer of the MTJ is the result of the large interface perpendicular magnetic anisotropy (iPMA) of ultrathin-film free-layers, reduced by the also large anisotropy produced by its own demagnetization field. The end result is very often a net perpendicular magnetic anisotropy (PMA) that falls somewhat short of the required for thermal stability for memory storage applications, specially, for sub-30 nm MTJ dimensions.

As the iPMA is a material-based property, there has been a lot of effort devoted to finding a free-layer material with larger iPMA to satisfy thermal stability. However, this has been an exceedingly hard endeavor made much harder by the series of other requirements that this material has to meet for memory applications, as for example, allowing relatively high tunneling magneto-resistance and having very low Gilbert damping constant. There are however FeCoB-based alloys and other materials that meet all these requirements except for a somewhat short iPMA. This critical shortcoming can be overcome by changing the planar geometry to a warped one, and this approach is valid regardless of the layer structure of the MTJ.

Scaling down magnetic bits in hard disk drive media beyond 2 Tb/in2 is a complex and challenging undertaking. The magnitude of magnetic field from write-heads has reached the limit and is no longer enough, using conventional hard disk drive technology, to switch the tiny magnetic bits that those densities entail. Currently, there are two technological approaches (HAMR and MAMR) that could venture in such densities but with serious difficulty, complexity and limitations. Warped bit-patterned media however can deliver densities far beyond 2 Tb/in2 in a relatively simple manner, using only magnetic field from a write-head to switch the bits. This new method has also the advantage of producing extremely quick switching events, in the order of just a few picoseconds.

BRIEF DESCRIPTION OF THE SEVERAL VIEWS OF THE DRAWINGS

FIG. 15. Two different bit packing layouts of warped bit-patterned media: staggered (15A) and aligned (15B).

DETAILED DESCRIPTION OF THE INVENTION

Magnetic Tunnel Junctions (MTJs) have served well the magnetic hard drive industry as key sensing device and are increasingly playing a role in the memory cells of Magnetic Random Access Memory (MRAM) devices. For MRAM applications, MTJs have come so far in the form of a pillar composed of a stack of thin films in planar configuration.

This arrangement however brings some challenges to speed, reliability and scaling that so far do not have satisfactory solutions.

Figure 1:
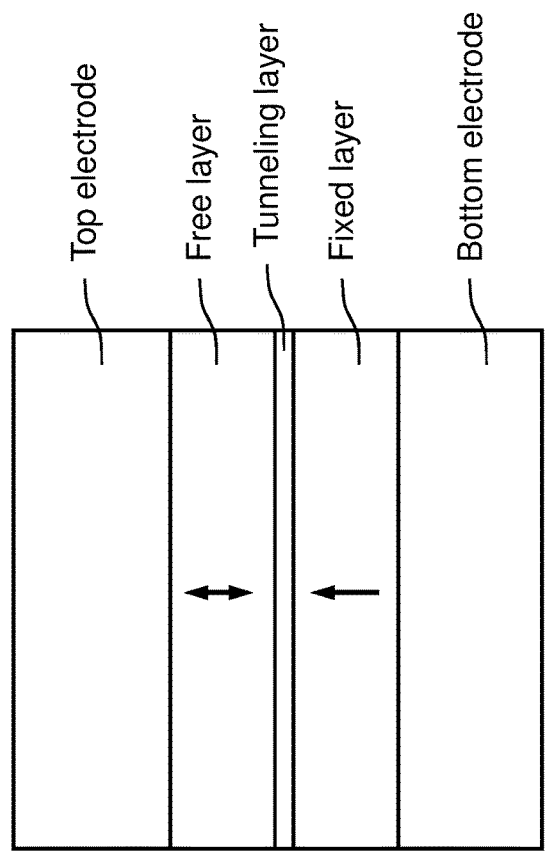
FIG. 1. Layer structure of a conventional planar magnetic tunnel junction.

Conceptually, the most basic MTJ is composed of five functional layers, as shown in FIG. 1 for the perpendicularly oriented MTJ. These layers are: the bottom electrode, which serves as electrical contact and as seed material for the growth of the next upper layers; the fixed-layer, which is a magnetic reference layer that would not switch under normal working conditions; the tunneling layer, which is a thin dielectric layer through which spin-polarized electron current tunnels through; the free-layer, which is the magnetic switchable layer used to store binary data and can also switch positions with the fixed-layer; and the top electrode, which serves as top protection and electric contact with the rest of the memory circuitry for the MTJ. Each one of this layer can in turn be composed of other layers that are meant to bolster its own functionality or improve the functioning of the whole MTJ as a memory device.

Although MRAM devices have been increasingly claiming share of the memory market, they still fall somewhat short of being the universal memory technology capable of replacing most instances of current memory solutions such as SRAM and DRAM. This is mainly due to scalability limitations and difficulty achieving reliable operation at sub-nanosecond switching speeds. Scalability limitations come mainly from not getting MTJs below 20 nm size or so, to have enough of an energy barrier against thermal activation for memory storage applications. Especially, as interface perpendicular magnetic anisotropy through which the energy barrier is currently obtained, decreases with MTJ size.

Figure 2:
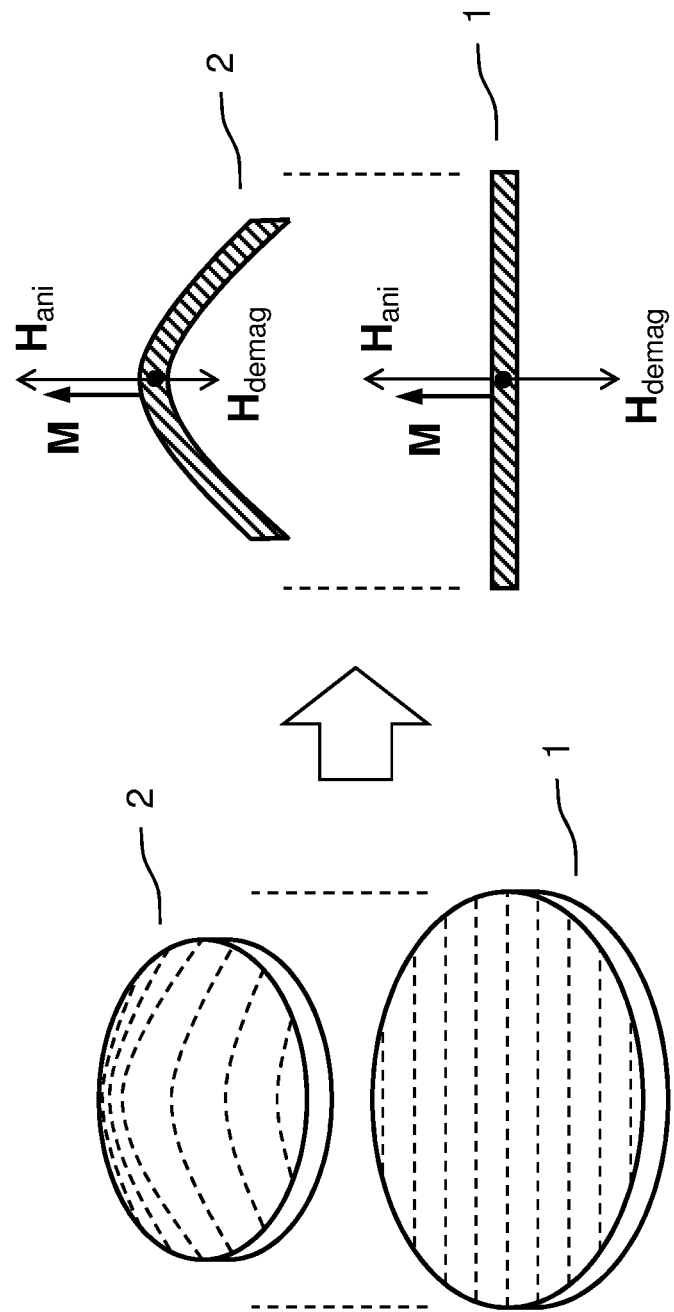
FIG. 2. Warped free-layer (2) and same-area planar free-layer (1). Three dimensional representation to the left and middle cross section to the right. The middle cross section shows the magnetization (M), the anisotropy field ($H_{ani}$), and the demagnetization field ($H_{demag}$) near the center point.

However, the low energy barrier problem is easily overcome by changing the geometry of the free-layer from planar to warped, as depicted in FIG. 2, which shows a planar free-layer 1 on the bottom and a same-area warped free-layer 2 on the top. By doing so, it is evident that for the same surface and volume, the warped geometry would occupy less circuit area than the planar geometry.

Figure 3:
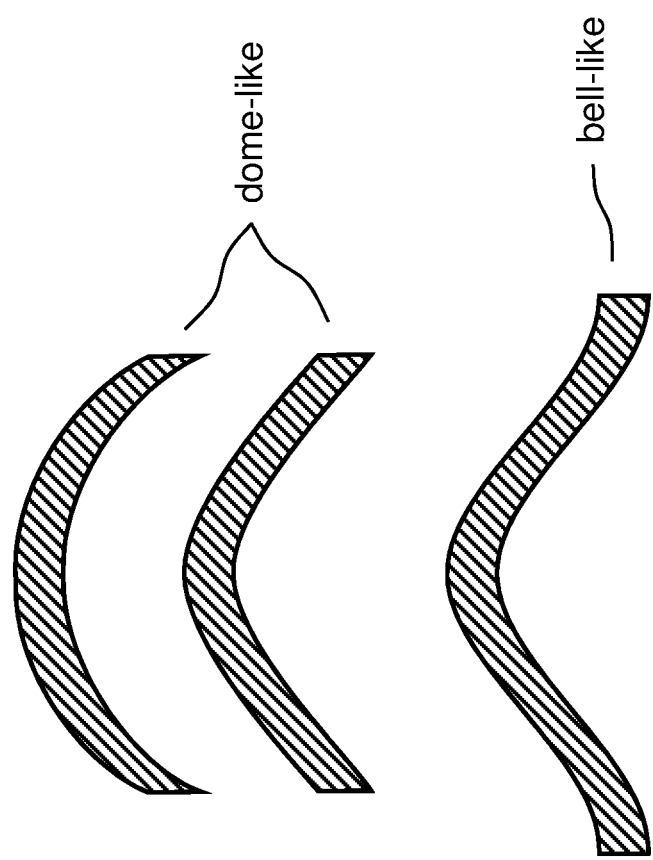
FIG. 3. Middle cross section of dome-like and bell-like warped free-layers.

The warped free-layer for the most part would have basically two forms. One form is a dome-like shape and the other is a bell-like shape. The middle cross sections of these two forms are depicted in FIG. 3. In the bell-like case, the outer edge of the warp is turned outwards, forming a sort of skirt at the edge. The dome-like shape may occupy less area or in some cases it may involve lower patterning resolution than the bell-like shape, and for that reason it may be the preferred shape for very high density MRAM applications. However, the bell-like shape allows tinkering with the dynamics and the energy of the switching events further than with the dome-like shape. The warp shape does not need to be circularly symmetric, although that is the most likely outcome of the manufacturing process. But, however they are obtained; non-circularly symmetric warped shapes are also valid for the purposes herein described as long as the warp contains a global maximum or a global minimum point (depending on it being convex or concave, respectively) somewhat centered.

Warping the free-layer produces a reduction of the demagnetization field as compared to the planar geometry, as depicted in FIG. 2 to the right hand side, which shows the middle cross section (cross section passing through the center of the object) of the figures to the left side. This reduction is the result of the angular and spatial distribution of the magnetization in the warped geometry compared to the planar geometry. It is obvious that the magnetic field coming from each point of the warped free-layer has a smaller component in the direction perpendicular to the free-layer's surface, adding up to a significantly smaller demagnetization field than in the planar geometry. As a result, the net perpendicular anisotropy on the warped geometry and thus its energy barrier significantly increases respect to the planar geometry. This by itself would allow an MTJ built with this geometry to scale down further, but there is still a much bigger factor in play brought about by the warped shape.

Skyrmions and Exchange Energy Barrier

Magnetically, the warped free-layer is in essence a skyrmion, formed and spatially trapped in the warp-shaped magnetic free-layer. Normally, skyrmions are known to form on thin flat magnetic media under certain conditions. For the warped free-layer, the conditions to form a skyrmion are mainly provided by the shape of the surface. So, it is a shape-driven skyrmion. The warped shape helps create a topological trap for the magnetization of the free-layer, with at least two stable configurations opposing each other and energy barriers in-between; in this case, exchange energy barriers plus the energy barrier of some net perpendicular magnetic anisotropy.

As with flat surface skyrmions, the magnetization in the warped free-layer tends to form vortexes. In the warped free-layer, the vortexes are shaped by the precession of the magnetization under the (perpendicular to the surface) iPMA, demagnetization field, and the exchange effective fields. All these fields have radial and vertical components in circular symmetry around the perpendicular central axis but varying with height and having gradients towards the tip of the warp. As a consequence of this, when the magnetization is taken out of its equilibrium position by a driving torque, neighboring magnetization vectors under these angle-differing fields tend to have a phase shift respect to one another in their precession around these fields. These phase shifts all over the warped shape tend to form vortexes roughly centered at the tip of the bulge. These vortexes involve a significant amount of exchange energy that acts as an energy barrier to switching by thermal activation. This energy barrier can be much larger than the one obtained through iPMA. Therefore, it can easily become the main energy barrier for the thermal stability of a MTJ.

The exchange energy barrier is dynamic; i.e., it is a function of the dynamics of the magnetization. Therefore, it is not exactly the same every time the MTJ is being switched, but for memory applications, it is consistent enough above certain value.

For clarity, some people may associate skyrmions with magnetization configurations like in Neel skyrmions where there is a zone in the center with spins up (or down), an outer rim of spins down (or up) and all other spin orientations in a transition from up to down (or down to up) in the zone between the center and the outer rim. In the case of the warped free-layer, the same magnetization configuration can be formed by extending the outer rim of the warped shape in an upward bent. However, doing that would imply increasing a few times over the area of a potential memory cell, as opposed to just taking the central bulge without the outer upward skirt. By only taking the central bulge, the warped free-layer already produces skyrmion behavior, with vortexes and large thermal stability. In this way, a very large area penalty is avoided for the sake of density in memory applications, and the skyrmion characteristics and advantages are retained.

Net Perpendicular Anisotropy

For it to be stable, the warped free-layer requires a net perpendicular (to the warped surface) anisotropy aside from the intervention of the exchange energy barrier. This net perpendicular anisotropy must be achieved with a combination of materials-based perpendicular anisotropy and the reduction of the demagnetization field through the warped shape. The net perpendicular anisotropy requirement is relatively easy to achieve with current materials. For instance, it is fairly easy to meet this requirement with MgO as seed layer and thin (~1 nm) FeCoB alloys or $Co_2FeAl$ Heusler alloy as free-layer material. There are plenty of those examples in the relevant literature, as well as other material combinations, along with the lower demagnetization field due to the warped shape, that can attain the required net perpendicular anisotropy, down to single digit nanometer size of the free-layer.

The magnetization in most of the warped free-layer is not completely perpendicular to the plane. For the most part, the magnetization has a radial component that will depend of the position on the warped surface, and on magnetic parameters such as the saturation magnetization, the stiffness exchange constant, the iPMA and bias field on the magnetization, as well as non-magnetic factors like the geometric shape and the dimensions of the warped surface. Obviously, thermal excitation will always add a rather random component on top of the result from the other factors.

Warped STT MTJs

Figure 4:
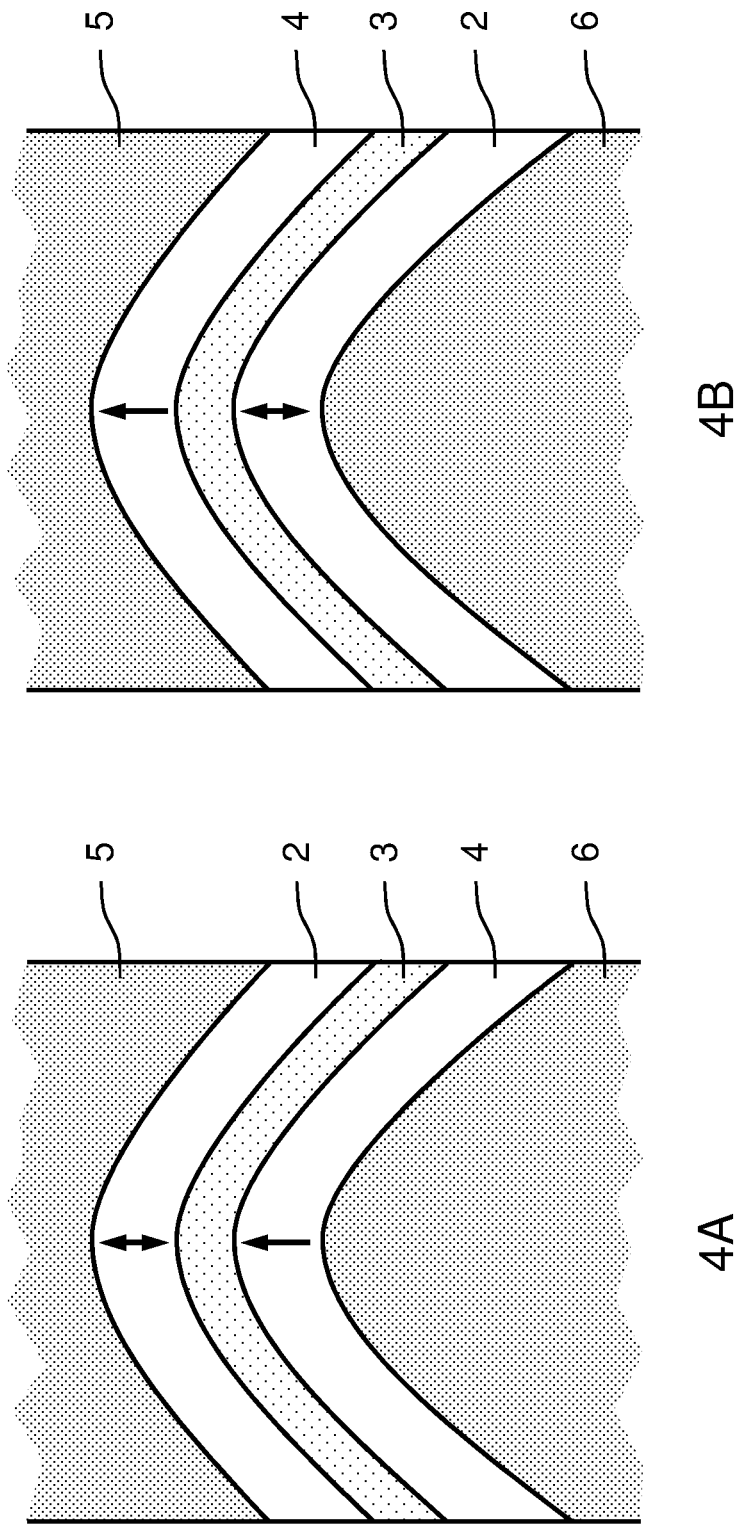
FIG. 4. Middle cross section of warped MTJs with warped free-layer above (4A), and underneath (4B) the tunneling layer (3).

In two embodiments of the present invention, the warped free-layer with dome-like shape was used to create warped magnetic tunnel junctions (warped MTJs). The middle cross sections of these warped MTJs are depicted in FIG. 4. The MTJs presented there are pillars that have the same parts as the planar MTJ shown in FIG. 1, i.e., bottom electrode 6, fixed-layer 4, tunneling layer 3, free-layer 2 (warped free-layer in this case) and top electrode 5. The magnetization of the fixed-layer 4 can also be oriented in the opposite magnetization to the one shown in FIG. 4. In this case, layers 2-4 are warped, the bottom electrode 6 has the bulge on the top that shapes layers 2-4, and the top electrode 5 sits on top of the bulge coming from layers 2-4.

In general, the magnetization of the warped fixed-layer is going to have a distribution of angles that will be defined by the set of factors that affect the magnetization of the warped free-layer, but in this case relative to the fixed-layer, and by the materials-based anisotropy and the complications in the layer structure of the fixed-layer. The end result is going to be a mostly perpendicular magnetization with a radial component and a random thermal contribution that is not going to be equal to the magnetization configuration of the warped free-layer and therefore, fixed- and free-layer magnetizations are generally not aligned.

As with planar MTJs, layers 2-6 are just named according to function; in general, each layer can be composed of several other layers themselves in order to improve the functionality of the MTJ. For example, in some embodiments, the fixed-layer is a perpendicularly magnetized synthetic anti-ferromagnet (SAF) to reduce the bias magnetic field of the fixed-layer on the free-layer. Also, as with planar MTJs, the warped free-layer 2 can be on top of the tunneling layer 3, as in FIG. 4A, or underneath, as in FIG. 4B.

Figure 5:
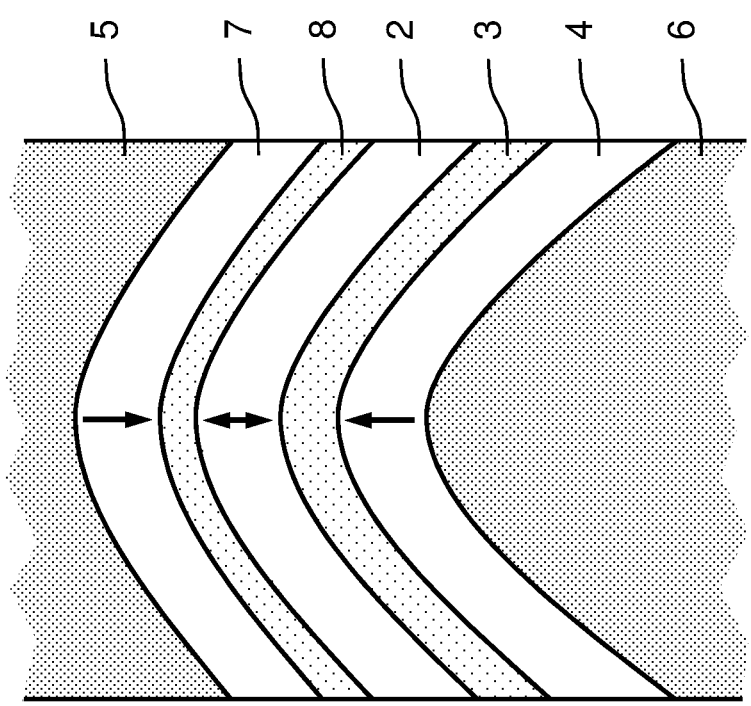
FIG. 5. Middle cross section of dual warped MTJ.

The warped MTJ concept also works for dual MTJs. Example of that is shown in FIG. 5, which depicts an embodiment of dual warped MTJ. The parts numbered in FIG. 5, have the same function as the parts with the same number in FIG. 4. Additionally, dual MTJs have a second tunneling layer 8 with the free-layer 2, and a second fixed-layer 7 with opposite magnetization orientation to fixed-layer 4, on the upper side of the tunneling layer 8. In some embodiments the tunneling layer 8 can be changed for a metallic layer, e.g. Cu, to form a giant magneto-resistance (GMR) junction instead of MTJ. The functioning of a dual MTJ can be found elsewhere. The distinctive characteristic here compared to the known dual MTJ concept, is the warped shape of the fixed-layers (7 and 4), the tunneling layers (3 and 8) and the free-layer (2).

Figure 6:
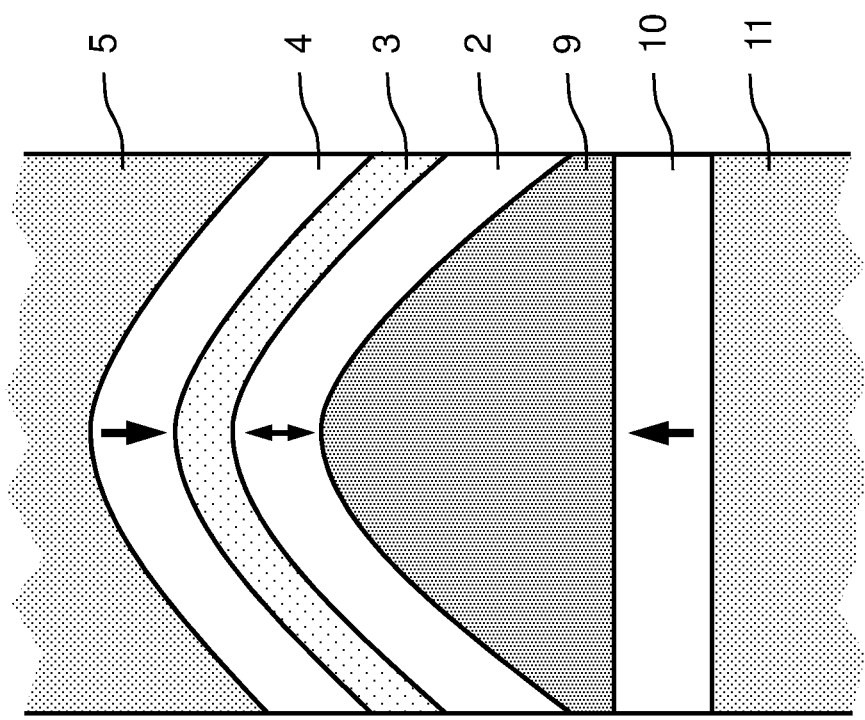
FIG. 6. Middle cross section of dual warped MTJ featuring a bulging transferring layer 9, a planar fixed-layer 10 and a planar bottom electrode 11.

A somewhat different embodiment of warped dual MTJ is shown in FIG. 6. In this case, the top part of the stack, from layer 2 to layer 5, is the same simple type of warped MTJ as in FIG. 4B. The bottom part, from layers 9 to 11, forms in conjunction with free-layer 2, a perpendicular GMR junction, thus forming a dual MTJ with the top part. Consequently, layer 9 is a spin transferring non-magnetic metallic layer with a bulging shape that holds the mold for layers 2 and up. Also, beneath the spin transferring layer 9 there is a fixed-layer 10 with planar geometry and perpendicular magnetization in opposition to fixed-layer 4, and a planar bottom electrode 11 beneath fixed-layer 10.

In other functionally equivalent embodiments, the warped MTJs are the same as the ones mentioned so far, but with concave instead of convex warped geometry.

All the MTJs described up to this point are meant to be switched using spin transfer torque (STT). Therefore, any optimization of materials, dimensions and shape should be customized for that switching mechanism.

Scalability

The warped MTJ concept is highly scalable and it can take thermally stable MTJs down to single digit nanometer size range. This comes mostly from the fact that the exchange energy barrier can easily attain very large values, even at scales of few nanometers and also by the fact that this exchange barrier does not necessarily lead to higher switching STT current density. To the contrary, the warped free-layer brings about a series of ways of decreasing switching STT current density that will be addressed later on.

Warped SOT-MTJs

Figure 7:
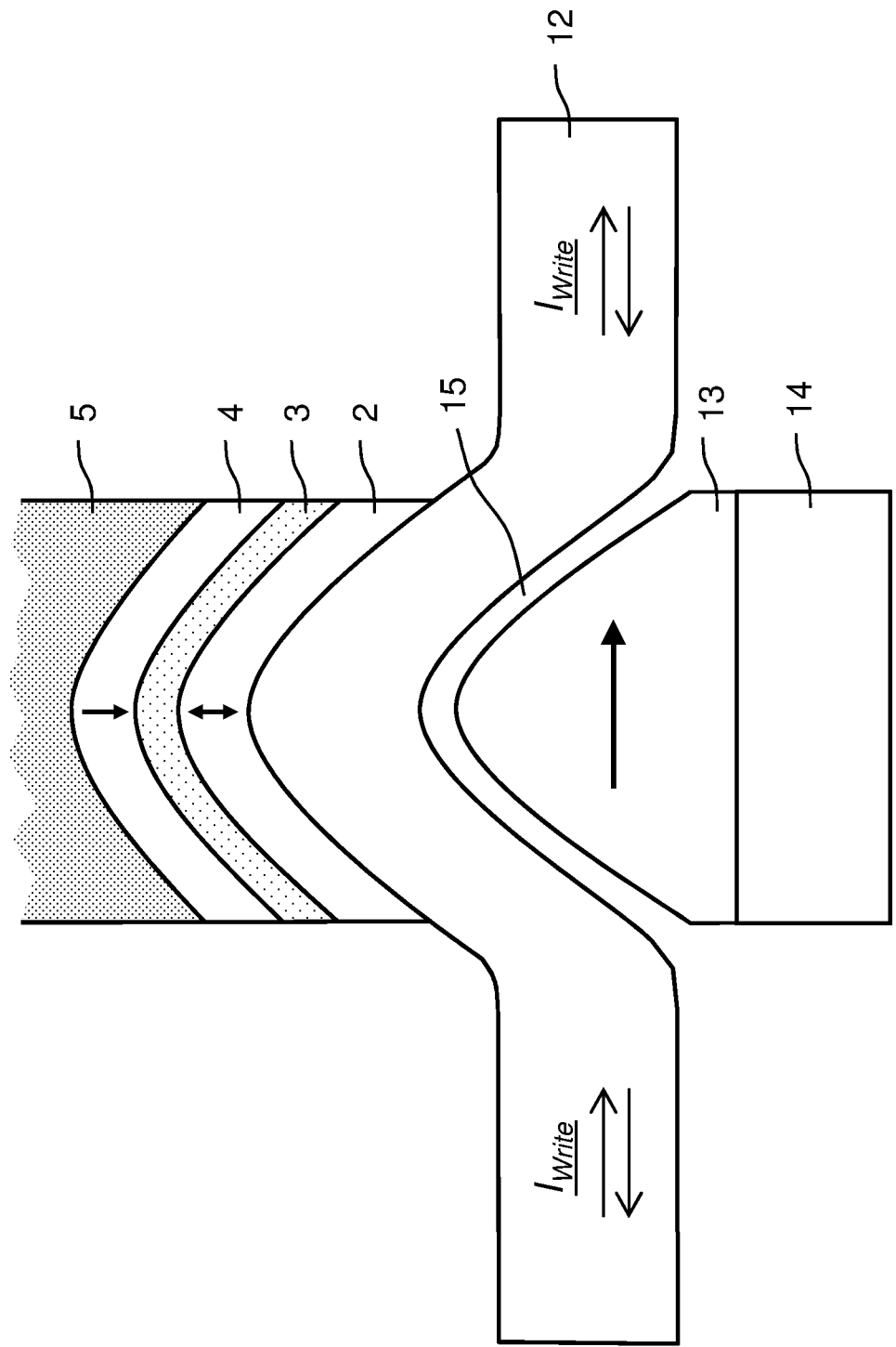
FIG. 7. Middle cross section of a warped SOT-MTJ with a biasing fixed-layer (10) below the warped free-layer (2).

The warped MTJ concept not only applies to STT-MTJs but it is also applicable to Spin Orbit Torque MTJs (SOT-MTJs), the fundamentals of which can be found elsewhere. For warped SOT-MTJs, the Hall metal, which is a non-magnetic metal layer (heavy metal, special metallic alloys, anti-ferromagnet or topological insulator) adjacent to the free-layer, that SOT-MTJs use for driving the switching of the free-layer, is also warped beneath the free-layer. An embodiment of that is shown in FIG. 7, which shows the middle cross section of a warped SOT-MTJ. In this case, layers 2 to 5 are the same as in FIG. 4. Layer 12 in FIG. 7 is the aforementioned warped Hall metal adjacent to the free-layer 2. This layer carries the write current for switching free-layer 2.

To add directionality and determinism to SOT switching events, the SOT-MTJ in FIG. 7 has a fixed ferromagnetic layer 13 with horizontal magnetization along the write current's flow direction, as the arrow inside layer 13 shows. This layer provides a bias magnetic field on the free-layer 2 that allows SOT-MTJs to switch the magnetization up or down in the free-layer, depending on the sense of the write current flow. A thin dielectric layer 15 electrically separates layer 13 from layer 12. Layer 14 is an anti-ferromagnetic layer used to pin down the magnetization of layer 13. Layer 14 can be composed of PtMn, IrMn or other anti-ferromagnet that can do the job.

Figure 8:
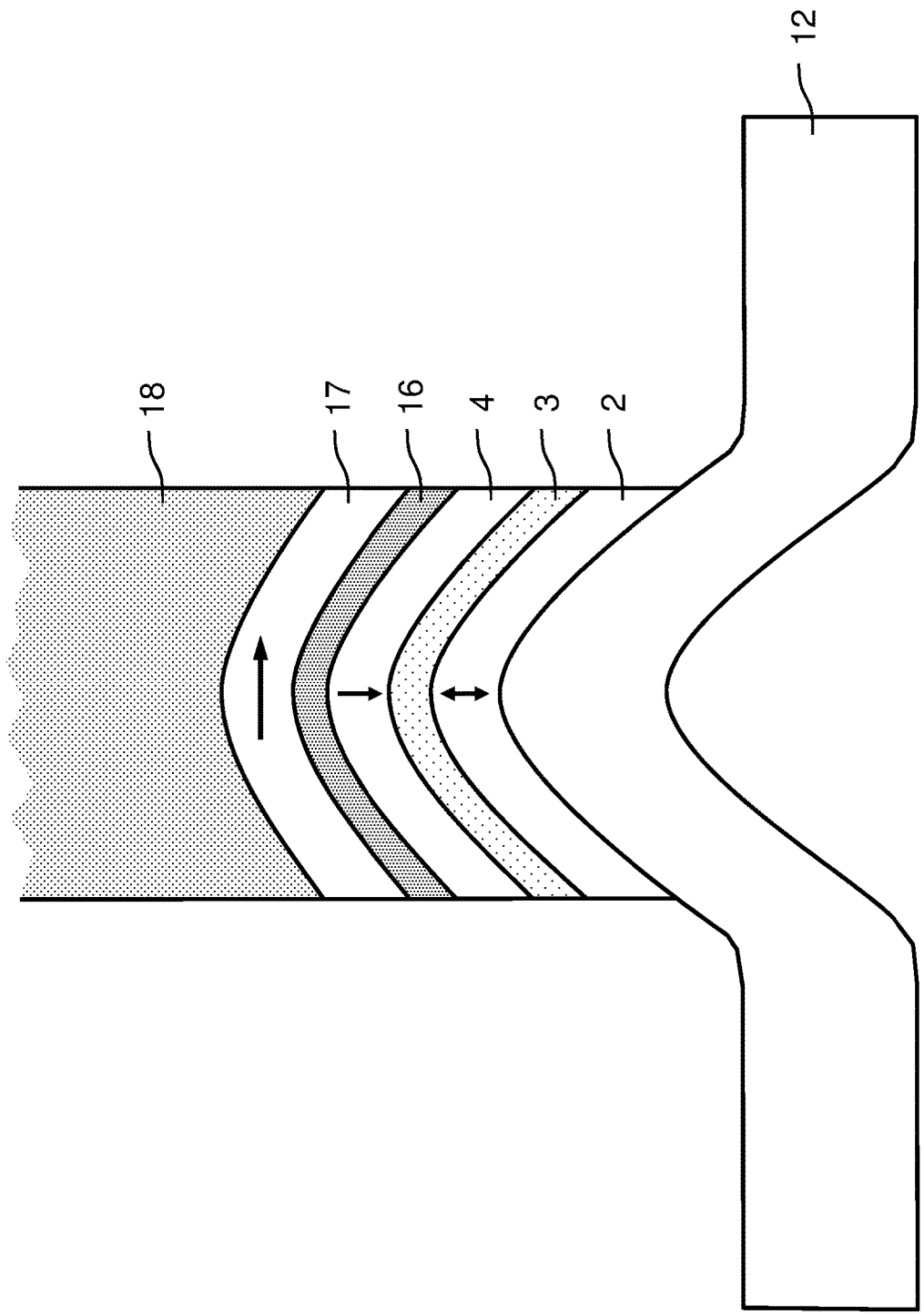
FIG. 8. Middle cross section of a warped SOT-MTJ with a biasing fixed-layer (14) in the MTJ stack, above the warped free-layer (2).

Another embodiment of warped SOT-MTJ is shown in FIG. 8, which depicts the middle cross section of it. This warped SOT-MTJ works the same way as the one in FIG. 7, except that the fixed ferromagnetic layer (layer 17) equivalent to layer 13 is part of the MTJ layer stack and it is placed above the warped free-layer instead of below. Layer 18 is an anti-ferromagnetic layer that plays the same function as layer 14, but now it is also part of the top electrode of the warped SOT-MTJ. Layer 16 is non-magnetic metallic separator layer that prevents exchange coupling between layer 17 and layer 4.

Figure 9:
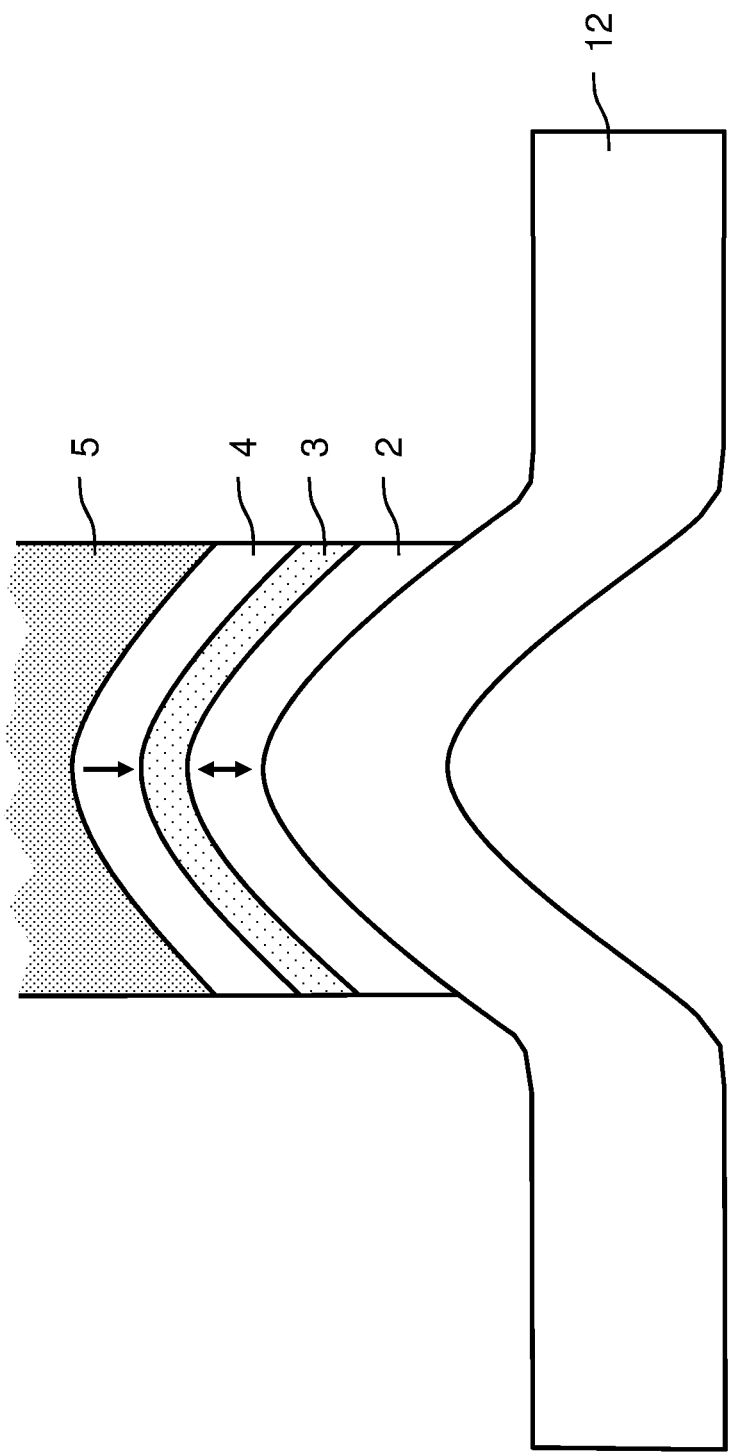
FIG. 9. Middle cross section of a warped SOT-MTJ with no biasing fixed-layer.

A structurally simpler embodiment of warped SOT-MTJ is shown in FIG. 9, which depicts the middle cross section of a warped SOT-MTJ that has no in-plane fixed magnetic layer (like layers 13 or 17) for providing a bias magnetic field on the warped free-layer; nor it has the related layers 14, 16 or 18. This warped SOT-MTJ is meant for memory cells with switching mechanisms that do not require an assisting magnetic field for deterministic switching. One such mechanism is a toggle switch, which requires a reading step prior to writing data in a bit. This mechanism can only switch a bit to the opposite state when required. Another such mechanism is one in which layer 12 is actually a bi-layer of heavy metals with opposite spin Hall angle. One more mechanism is the combination of STT and SOT to get deterministic bipolar switching.

SOT-Boosted Warped STT-MTJs

Figure 10:
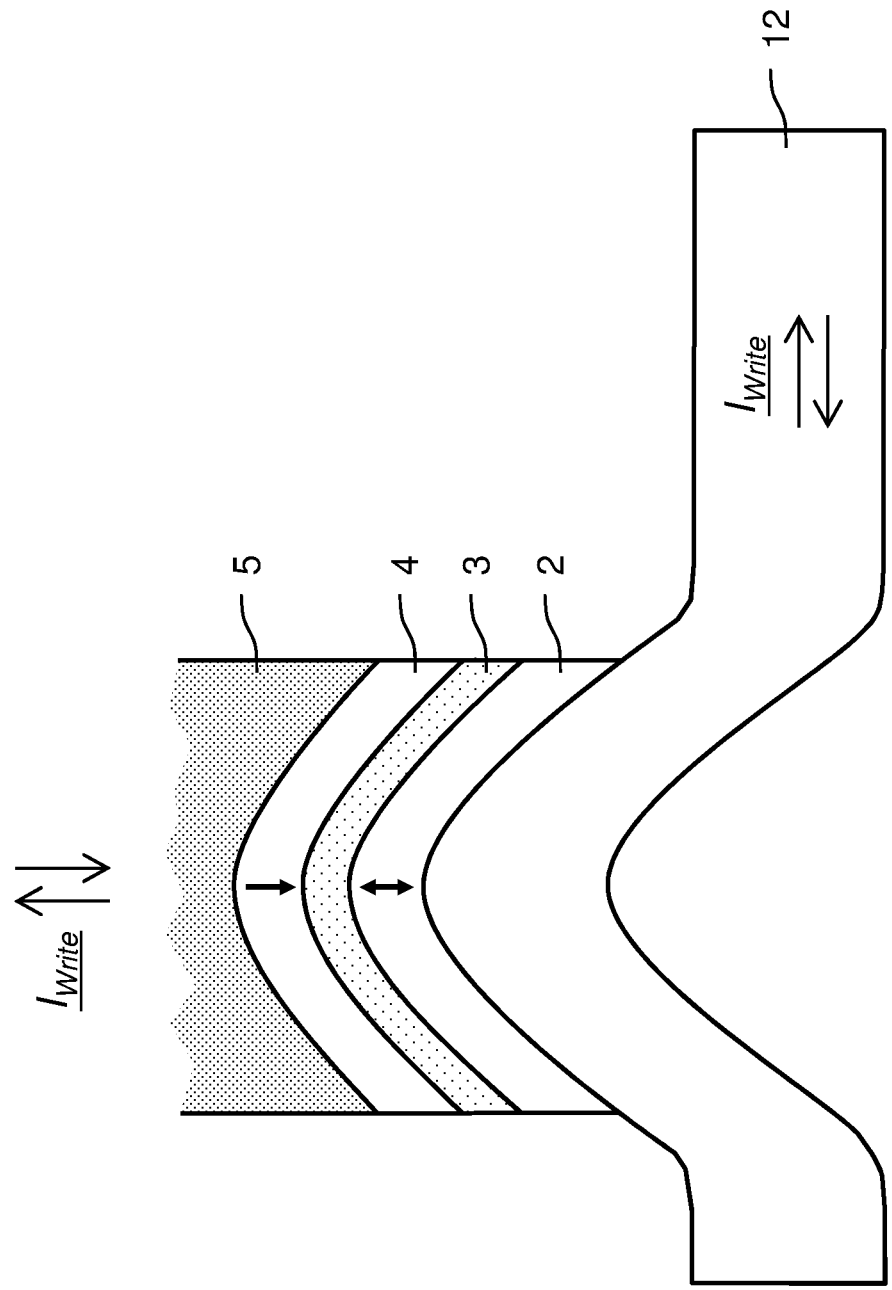
FIG. 10. Middle cross section of an SOT-boosted warped STT-MTJ with no biasing fixed-layer featuring a one-sided Hall metal 12.

There is another way in which STT-MTJs can be aided by spin orbit torque, and that applies to the MTJ shown in FIG. 10. In this MTJ, the bottom electrode is a thin Hall metal 12 underneath the free-layer 2, in which the STT current that goes through the free-layer also flows to one side (to the side electrically connected) along the Hall metal, so that there is an SOT component on the free-layer magnetization on top of the STT one. The magnetic tunnel junction is then optimized for read/write operations as a warped STT-MTJ and the SOT component is treated as a boost to write operations, instead of the other way around. Thus, the read/write current densities are STT level instead of SOT level.

This configuration has some advantages over just SOT- and just STT-MTJs. That is, there is a significant switching speed increase of this configuration over an equivalent one with just STT switching. Also, it allows fast switching with far lower current density than is normally required for SOT-MTJs and significantly lower than for STT-MTJs, therefore reducing potential device reliability concerns. Design-wise, this configuration allows the simplicity of a one-resistor-one-transistor memory bit device (like STT-MTJ—based memory devices) as opposed to SOT-MTJ—based memory devices that often require two transistors per MTJ. On that basis, it allows potentially higher density than SOT-MTJ—based devices, but due to the sideways running of the Hall metal it would allow lower density than STT-based devices.

Figure 11:
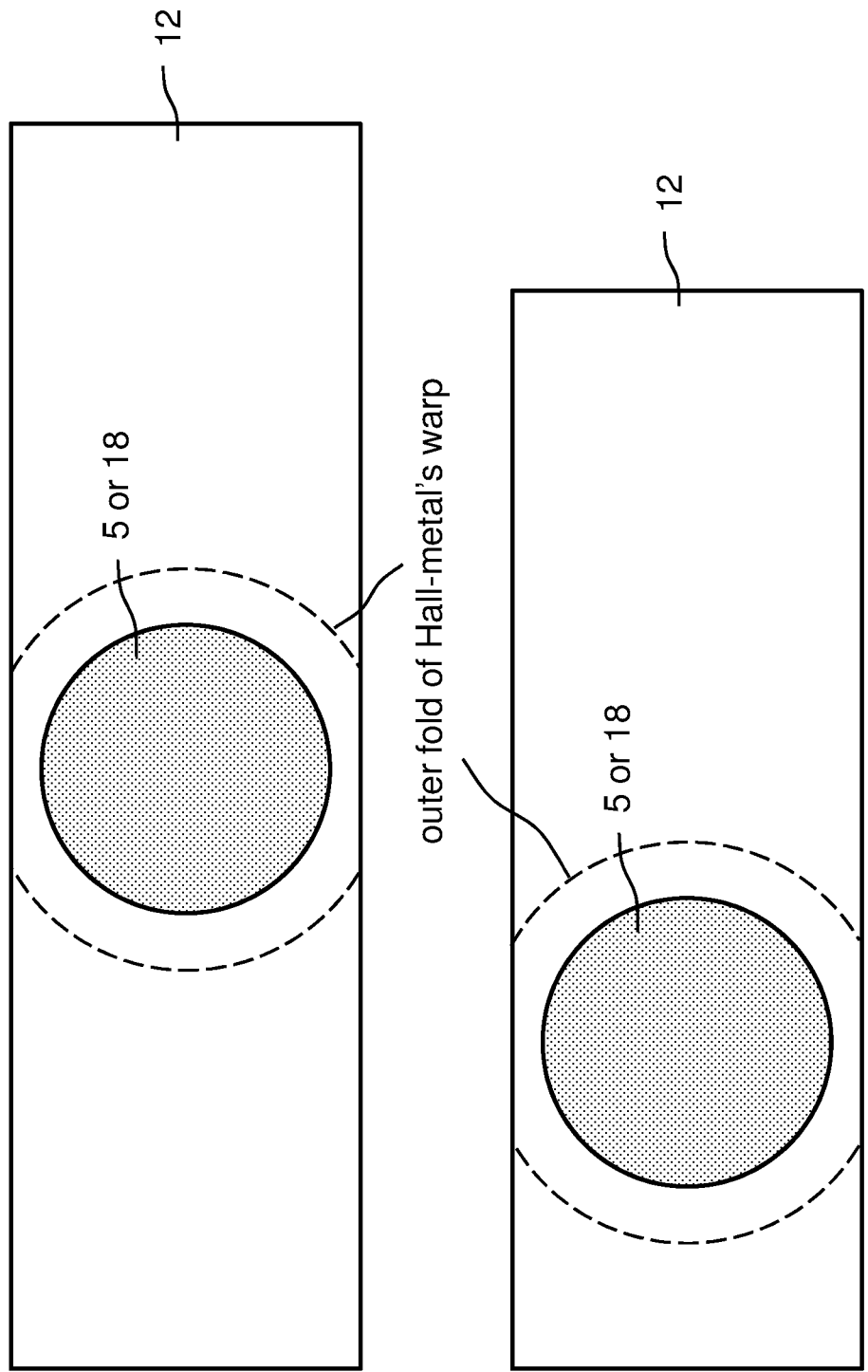
FIG. 11. Plan view of warped SOT-MTJs depicted in FIGS. 7-9 (top drawing) and FIG. 10 (bottom drawing).

Top-down views of the warped SOT-MTJs shown in FIG. 7, FIG. 8, FIG. 9 (top drawing) and FIG. 10 (bottom drawing) are shown in FIG. 11. For manufacturing purposes, normally the width of the Hall metal 12 should be a little larger than the width of the MTJ stack that sits on it, as clearly portrayed in FIG. 11.

Some Generalities of Warped MTJs

Figure 12:
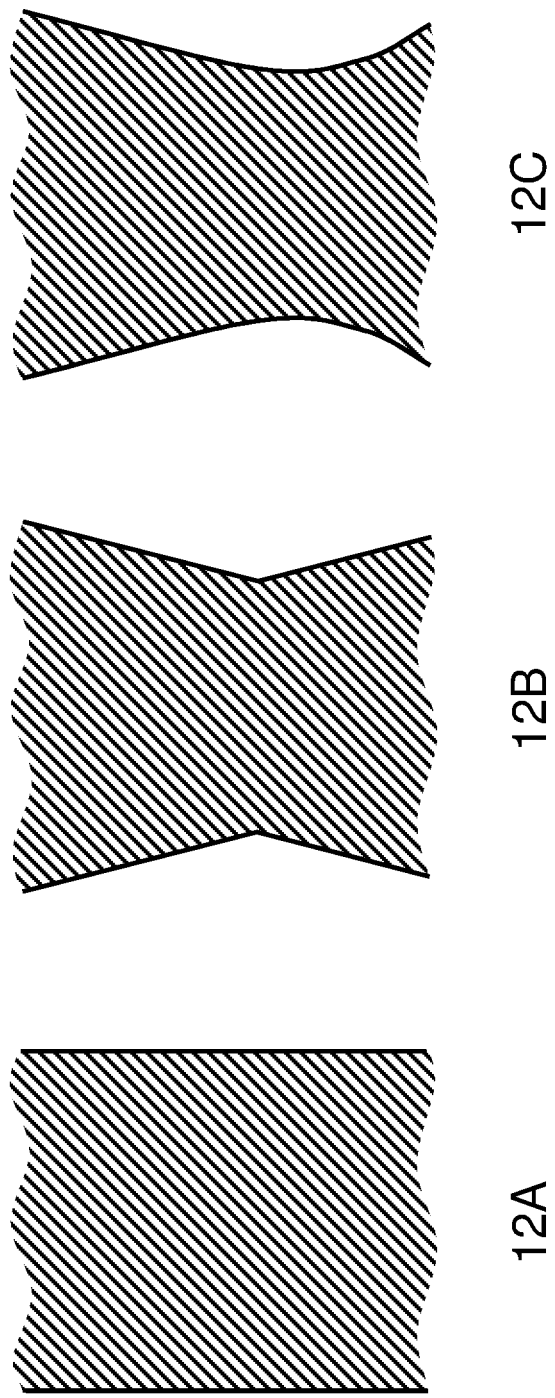
FIG. 12. Different middle cross section profiles for MTJ pillars: cylindrical (12A) and hourglass shape (12B & 12C).

The warped MTJ pillars can have many cross section profiles, depending on the layer stack configuration, the manufacturing methods and the desired profile. Three different such profiles are shown in FIG. 12, which shows the middle cross section profiles for warped MTJ pillars with cylindrical shape (FIG. 12A) and hourglass shape (FIGS. 12B & 12C). In the cases 12B and 12C, the neck of the hourglass shape would be produced in the zone where the molding bulging element meets the first warped layer of the MTJ stack (e.g., at junction of bottom electrode 6 with fixed-layer 4, in FIG. 4A).

To form an MRAM cell, the warped MTJs should be connected from the top to a read-bit-line through layers 5 or 18, accordingly. The warped SOT-MTJs must also connect the Hall metal 12 on one end to a write-bit-line (except for MTJ in FIG. 10 which foregoes that connection) and to a cell-select transistor or diode on the other end (valid for MTJ in FIG. 10 as well). In contrast, warped STT-MTJs should connect to a cell-select transistor or diode through layers 6 or 11, accordingly.

One skilled in the art would readily recognize that the warped SOT-MTJs presented here can have a functionally equivalent concave version instead of the convexly warped shown so far.

Advantages of Warped MTJs

Both STT and SOT driven MTJs can be engineered to take advantage of the warped MTJ concept. Chief among the advantages is its ability to easily attain high thermal stability through exchange energy barriers. That key advantage gives way to others, like scalability down to a few nanometers, which also brings the possibility of proportionally reducing the write current. Further reduction of write current or switching time is also enabled by the exchange energy barrier, as it allows more flexibility on the free-layer's material parameters, given that high perpendicular anisotropy is no longer required.

As the free-layer of warped MTJs does not need to sustain the large perpendicular magnetic anisotropy (PMA) of planar MTJ configurations, the thickness and saturation magnetization (Ms) of the free-layer can in principle be reduced to get a reduction of either the STT switching current or the switching time. Furthermore, much lower net PMA can be used to generate considerably slower precession frequency of the magnetization, thus lowering the damping torque opposing the switching torque, therefore having the effect of requiring less STT write current or switching faster or both. Also, flexibility with the free-layer material could allow materials with smaller stiffness exchange constant, which also has the effect of yet slower magnetization precession frequency and thus even less damping torque.

Another advantage of the warped MTJ configuration over planar is that there are starting non-zero angles between the fixed- and the free-layer magnetizations at the beginning of any STT switching event. That, not only makes the event deterministic but it also makes it faster or more economic in terms of write current. The geometry of the warp, the stiffness exchange constant, Ms and iPMA of the free- and the fixed-layer are key elements defining this angular distribution, which should be a significant aspect of engineering a warped MTJ.

As noted so far, warped STT-MTJs allow faster switching through several mechanisms that combined could produce MTJs with sub-nanosecond switching time, without increasing voltage across the tunneling layer that could compromise the integrity of the MTJ. Or else, any current reduction achieved through the above mentioned mechanisms can translate instead into lower switching current density than comparable planar MTJs, which would allow thicker tunneling layer. The consequences of that are a more reliable MTJ and a higher tunneling magneto-resistance (TMR), which allows faster reading of the MTJ resistance state.

SOT-based MTJs per se allow faster switching and higher TMR than STT-based MTJs, given that the switching current does not go through the MTJ stack. Consequently, SOT MTJs do not suffer from reliability issues at the tunneling layer. But high write current density through the Hall metal 12 or other parts of a SOT-MRAM cell could pose a challenge to cell reliability. However, the ability to reduce the warped MTJ size and/or reducing SOT write current density through material properties like lower iPMA (which comparatively increases the SOT component) and higher damping constant (which increases switching speed thus requiring less current to achieve same results), thanks to lower constraints on the free-layer, could easily dispel such concerns.

In summary, reliable sub-nanosecond MTJ operation is attainable with STT-, SOT- and STT+SOT-based warped-MTJs that could be used to replace SRAM and DRAM in far more instances than current MRAM technologies could, and there would be clear gains in speed, memory density, energy efficiency and non-volatility.

Warped Bit-Patterned Media

In addition to using warped free-layers to construct warped MTJs, the concept can also be applied to bit-patterned media, to take advantage of the warped free-layer's scalability and large capacity for providing thermal stability. Warped bit-patterned media could then be used on the platter of hard disk drives (HDD), with potential gains in energy efficiency, speed and memory density.

HDD technology has been delivering sustained growth of memory density over the years by successfully downscaling the magnetic bits on continuous granular media. However, the conventional approach to this technology has reached its limit and to keep it going, new concepts have been introduced to assist this technology with further downscaling. Since the magnetic field of write-heads is no longer enough to switch smaller bits over the thermal activation barrier, the new concepts assist the switching by momentarily lowering the effective barrier for the selected bit. One way is by locally heating the bit with a laser (this technology is called Heat Assisted Magnetic recording—HAMR) and the other one is by selectively exciting the bit with microwaves (this technology is called Microwave Assisted Magnetic Recording—MAMR). These approaches are fine, but they both face intrinsic challenges and limitations that can be circumvented with a different take on HDD technology based instead on 'warped' bit-patterned media.

Bit-patterned media as a concept has been in development for quite some time and it allows the downscaling of magnetic bits further than granular media, by pattering magnetic island bits instead of having the multigrain magnetic bits of continuous granular media. The bit-patterned media approach, as envisioned, solves some issues but still would depend on HAMR or MAMR, with their challenges and limitations, for switching tiny magnetic bits. Warped bit-patterned media, on the other hand, allows the downscaling and super-fast switching of magnetic bits without the assist of heat or microwaves, but just using magnetic field from a write-head.

Figure 13:
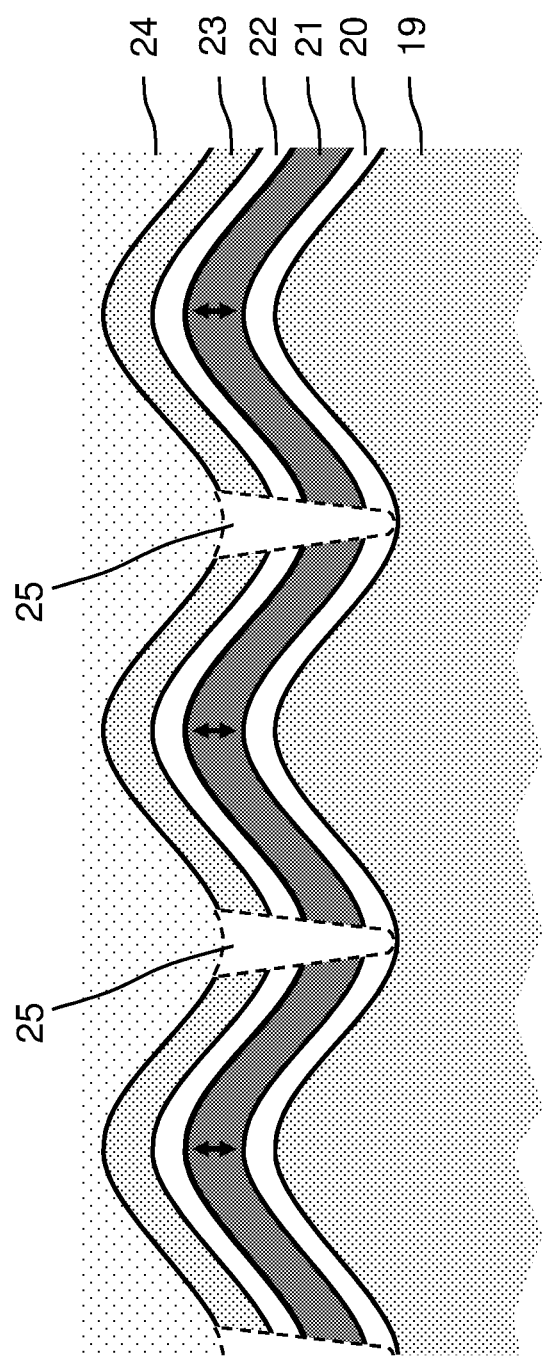
FIG. 13. Middle cross section of 3-bits segment of warped bit-patterned media with convex warped free-layer.

The most basic structure of warped bit-patterned media is laid out in FIG. 13, which shows the middle cross section of a 3-bits segment. The main feature of a warped bit-patterned media is the warped free-layer 21, which is a very similar magnetic element to the one used on warped MTJs 2. These warped free-layers 21 rely on ferromagnetic materials with low Gilbert damping constant (preferably <0.03) and on having iPMA at its interface with at least an adjacent layer. There are many materials that fit this purpose, but it would be easy and convenient to use the ones that have already been investigated for perpendicular MTJs, like Co, Fe, CoFe, CoFeB alloys, Heusler alloys, and many others.

Thermal stability for warped bit-patterned media is achieved mainly through exchange energy barrier. Some net PMA must also support the stability of the two stable magnetization configurations, the one with mostly up and the one with mostly down magnetization, required for storing binary information ("0" & "1"). The net PMA is achieved through iPMA produced at the interface of the free-layer 21 and adjacent layers, and shape-reduced demagnetization field, as occurs with warped free-layers. A common example of layers 20 and 22 are thin (~1 nm) layers of MgO. Some embodiments do not have layer 22 and rely only on seed layer 20 for iPMA. Other embodiments may use layer 22 as the main or only source of iPMA, instead of seed layer 20.

The rest of the structure is composed of a substrate 19, which holds the pattern of bumps for the warped bits, layer 23, which is a protective layer also used as hard mask during patterning, layer 24, which is a flatten protective and capping layer, and bit-separator 25, which separates the bits into individual magnetic islands and prevents bit-to-bit exchange interaction. Some embodiments may get rid of layer 23, just to reach a bit higher magnetic field from the write-head. Some embodiments may go without layer 20 or both layers 20 and 22 and get iPMA at the interface of the warped free-layer 21 and the substrate 19.

Figure 14:
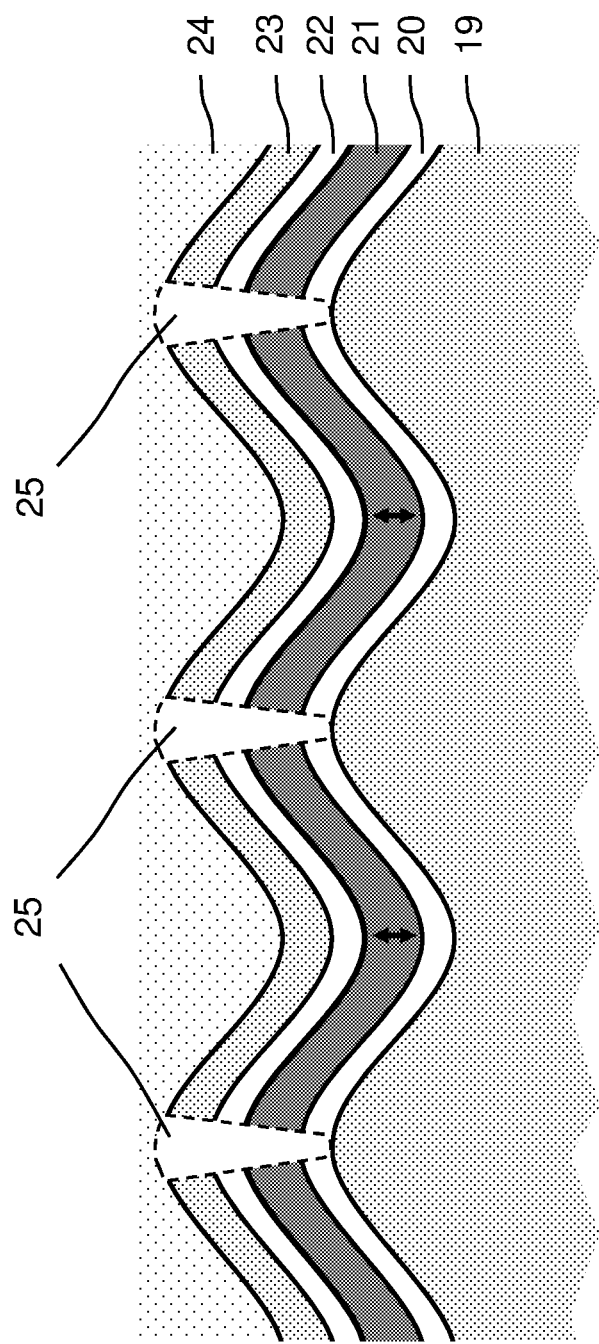
FIG. 14. Middle cross section of 2-bits segment of warped bit-patterned media with concave warped free-layer.

A more magnetically efficient and convenient configuration for warped bit-patterned media is shown in FIG. 14. This configuration is the concave version of the one shown in FIG. 13.

The bit-separator feature 25 is actually a continuous network defined by the negative space between bits, and its shape and width are dependent on the bits layout and manufacturing capability. Example of that, seen from the top, is depicted in FIG. 15 for two different bits packing layout: staggered (FIG. 15A) and aligned (FIG. 15B).

One skilled in the art would readily recognize the infinite selection of materials that can compose layers 19, 23, 24 and 25. As a mode of example, they could be Ta, Ta, C, C, respectively. A protective top carbon (C) layer is commonly used on HDD media. Bit-separator 25 can also be the result of layer 21 growth process, in which some material segregate to the edges and form a non-magnetic residue, instead of a patterned feature that is filled with a non-magnetic material. In such cases, bit-separator 25 would only cut through layer 21.

Depending on the materials used, degrees of protection and methods of manufacturing, there may be the need for adding extra layers to or removing some from the overall structure shown in FIG. 13 and FIG. 14. That is considered within the scope of this patent if the distinct working principles and basic geometry are the ones outlined here.

Switching Warped Bits in Hard Disk Drive Applications

The preferred bit switching mechanism for warped bit-patterned media is a toggle mechanism based on precession torque and not on damping torque, like every other HDD technology. In this case, what is meant by precession torque is the torque resulting from the cross product of the magnetization and the effective magnetic field. For the toggle mechanism, the switching magnetic field must be generated by a longitudinal write-head, instead of a perpendicular one. So, the field is going to have significant in-plane components.

For toggle-switching the warped bit, the switching energy does not need to go above the thermal activation energy barrier, which would be heavily defined by exchange energy barrier. Instead, the applied magnetic field which is initially oriented mostly orthogonally to the equilibrium magnetization, will establish a magnetic field configuration for the magnetization with a dominant component pointing to that orthogonal direction at every point. In other words, the applied magnetic field will override the radially pointing components of the anisotropy and demagnetization fields, such that the magnetization will not do vortexes but mostly precess around this dominant external field (plus minor interference from other components), with some degree of coherence, therefore generating a drastically lower exchange energy barrier for the switch, as no vortexes are formed. This switching field is going to be applied until most of the magnetization crosses to the other side in less than an average half precession. The magnetization would then settle down to the opposite magnetization configuration after a while.

The concave warped configuration of FIG. 14 can have a more effective use of the magnetic field from a longitudinal write-head than the convex configuration of FIG. 13. Its shape is more closely aligned with the magnetic field from the write-head, meaning that the field is generally more orthogonal to the magnetization of the concave warped free-layer than to the convex one.

For the toggle-switching mechanism it would help to have a net anisotropy field as small as feasible so that the switching magnetic field does not have to compensate much for the net anisotropy field in order to get a roughly orthogonal net switching field on the magnetization. The fact that the thermal activation barrier can be based mostly on exchange energy and not on anisotropy energy allows having very small net anisotropy field on the bits. It would also help to have a relatively small damping torque on the free-layer magnetization (through small Gilbert damping coefficient, $\alpha < 0.03$ or so) so that it can only play a small disrupting role on the precession of the magnetization. Low Gilbert damping coefficient and some iPMA are common characteristics of the free-layer's materials that have been considered for perpendicular MTJs and therefore they are excellent candidates for warped bit-patterned media.

Thus, at equilibrium, the geometrical configuration of the magnetic field on the warped free-layer energetically confines the magnetization. Then the quasi orthogonal switching field modifies the equilibrium magnetic field configuration on the magnetization to produce a large reduction of the exchange energy barrier and a precession switch. The magnitude of the equilibrium magnetic field configuration can easily be made low enough (through low net anisotropy) so that switching can take place with magnetic fields of magnitudes commonly used in HDD write-heads, which would produce very short switching times. For instance, for switching magnetic fields of around one Tesla, the field just needs to be applied for a few picoseconds, given the quick precessions involved.

For any given switching field strength, the precession driven torque is far larger than the damping-driven torque of conventional HDDs, Thermally Assisted Magnetic Recording and Microwave Assisted Recording. This is in part because for damping-driven switching, the switching magnetic field is always reduced significantly by the anisotropy field of the bit, which is large in those cases, as anisotropy is solely responsible for the bit's thermal stability. The damping torque is then proportional to this reduced net driving field, to the bit's Gilbert damping coefficient (which is a number much lower than 1) and to the sine of the angle between the net field and the magnetization (which is also much smaller than 1, for the most part). The precession driven torque, on the other hand, has a rather undiminished switching field generating the torque, a sine factor close to 1, no Gilbert damping factor in the equation to reduce it and no significant damping torque to disturb it (because of small $\alpha$). Therefore, HDD technology based on warped bit-patterned media and precession torque can always have a much faster writing process than current HDD technology.

The ability to switch at energies much lower than the thermal activation barrier provides great downsizing scalability to warped bit-patterned media, as bits with very small magnetic moment can be made thermally stable and at the same time switchable with magnetic fields that can be provided with current write-head technology. The limits of warped-bit patterned media are going to be defined more by engineering than by Physics, as there are many degrees of freedom in this system to support the underlying working principles. To mention a few: there are the all-important geometrical factors, the stiffness exchange constant, that has a large impact on thermal stability, the saturation magnetization, the iPMA, the Gilbert damping coefficient and the write-head's magnetic field.

Advantages of Warped Bit-Patterned Media

Aside from the known advantages of bit-patterned media over conventional granular media, warped bit-patterned media has some advantages over conventional bit-patterned media approaches. First of all, there is the ability to forgo heat- and microwave-assisted switching. Although warped bit-patterned media could also benefit from heat-assisted writing, it can just do without and thus avoid all issues related to heat-assisted magnetic recording, like potential unselected bit disturb, heat management, system complexity (which is always a challenge to yield and cost), speed limitations, and other issues. Secondly, warped bit-patterned media has the potential to have significantly faster write operations than any other approach thanks to precession torque switching instead of damping torque switching. Thirdly: simpler, more robust, more reliable, higher density and higher speed lead to potential lower costs than the other approaches and to potential new applications.

Materials in General

The warped free-layer, warped MTJs and warped bit-patterned media concepts are not bound to any choice of materials. What is relevant is the principle of at least warping the free-layer of MTJs and bit-patterned media, in order to tap into additional thermal stability coming from both lower demagnetization field and from exchange energy barrier. It is also about tapping into the other advantages outlined here, that open up as a consequence of the warped geometry. Specific material combinations are covered within the scope of this patent if warping is used at least on the free-layer of the devices herein described, in order to benefit from said advantages.

What it is claimed is:

1. A magnetic storage device herein referred to as "warped free-layer" comprising: a shape-based dynamic magnetic skyrmion which is a thin film ferromagnetic element shaped in the form of a low-rising bell or dome, either convex or concave, less than 30 nm in diameter, the warped free-layer having a shape including a curved apex and sloping sidewalls extending from the apex, the apex having a radius of curvature smaller than a radius of the diameter of the warped free-layer, the shape of the warped free-layer is configured such that supplemental exchange energy barriers achieve thermal stability through the induction of dynamic vortex magnetization configurations under expressly designed radial components of demagnetization and material-based perpendicular anisotropy fields when a magnetization switch is attempted on it.

2. A perpendicular warped magnetic tunnel junction device, designed to be switched with a spin transfer torque mechanism, comprising:

a bottom electrode with a warped, bulging or dished geometry;

a fixed-layer with warped geometry, comprising a single ferromagnetic layer or a plurality of ferromagnetic layers forming a synthetic anti-ferromagnetic structure, disposed over the bottom electrode;

a tunneling layer with warped geometry, disposed over the fixed-layer;

the warped free-layer of claim 1, disposed over the tunneling layer;

a top electrode with a warped, bulging or dished geometry, disposed over the warped free-layer.

3. A perpendicular warped magnetic tunnel junction device, designed to be switched with a spin transfer torque mechanism, comprising:

a bottom electrode with a warped, bulging or dished geometry;

the warped free-layer of claim 1, disposed over the bottom electrode;

a tunneling layer with warped geometry, disposed over the warped free-layer;

a fixed-layer with warped geometry, comprising a single ferromagnetic layer or a plurality of ferromagnetic layers forming a synthetic anti-ferromagnetic structure, disposed over the tunneling layer;

a top electrode with a warped, bulging or dished geometry, disposed over the warped fixed-layer.

4. A perpendicular warped magnetic tunnel junction device, designed to be switched with a spin transfer torque mechanism, comprising:

a bottom electrode with a warped, bulging or dished geometry;

a fixed-layer with warped geometry, comprising a single ferromagnetic layer or a plurality of ferromagnetic layers forming a synthetic anti-ferromagnetic structure, disposed over the bottom electrode;

a tunneling layer with warped geometry, disposed over the fixed-layer;

the warped free-layer of claim 1, disposed over the tunneling layer;

a second tunneling layer with warped geometry, disposed over the warped free-layer;

a second fixed-layer with warped geometry, comprising a second single ferromagnetic layer or a plurality of second ferromagnetic layers forming a second synthetic anti-ferromagnetic structure, disposed over the second tunneling layer;

a top electrode with a warped, bulging or dished geometry, disposed over the second fixed-layer.

5. A perpendicular warped magnetic tunnel junction device, designed to be switched with a spin transfer torque mechanism, comprising:

a planar bottom electrode;

a planar fixed-layer, comprising a single ferromagnetic layer or a plurality of ferromagnetic layers forming a synthetic anti-ferromagnetic structure, disposed over the planar bottom electrode;

a spin transferring layer with a bulging top and flat bottom geometry, disposed over the planar fixed-layer;

the warped free-layer of claim 1, disposed over the spin transferring layer;

a tunneling layer with warped geometry, disposed over the warped free-layer;

a second fixed-layer with warped geometry, comprising a second single ferromagnetic layer or a plurality of second ferromagnetic layers forming a second synthetic anti-ferromagnetic structure, disposed over the tunneling layer;

a top electrode with a warped geometry, disposed over the second fixed-layer.

6. A perpendicular warped magnetic tunnel junction device, designed to be switched with a spin orbit torque mechanism, comprising:

a planar antiferromagnetic layer;

a biasing fixed-layer with bulging top and flat bottom geometry, with a function of producing a magnetostatic bias on a warped free-layer along a direction of a Hall metal layer's current flow, for adding directionality to spin orbit torque switching events, comprising a single ferromagnetic layer and disposed over the planar antiferromagnetic layer;

a dielectric layer with warped geometry, disposed over the fixed-layer;

a Hall metal layer with warped geometry, disposed over the dielectric layer;

the warped free-layer of claim 1, disposed over the Hall metal layer;

a tunneling layer with warped geometry, disposed over the warped free-layer;

a second fixed-layer with warped geometry, comprising a single ferromagnetic layer or a plurality of ferromagnetic layers forming a synthetic anti-ferromagnetic structure, disposed over the tunneling layer;

a top electrode with a warped geometry, disposed over the second fixed-layer.

7. A perpendicular warped magnetic tunnel junction device, designed to be switched with a spin orbit torque mechanism, comprising:

a Hall metal layer with warped geometry;

the warped free-layer of claim 1, disposed over the Hall metal layer;

a tunneling layer with warped geometry, disposed over the warped free-layer;

a fixed-layer with a warped geometry, comprising a single ferromagnetic layer or a plurality of ferromagnetic layers forming a synthetic anti-ferromagnetic structure, disposed over the tunneling layer;

a non-magnetic metallic separator layer having warped geometry, thick enough to prevent exchange interaction between adjacent magnetic layers, disposed over the fixed-layer;

a biasing fixed-layer with warped geometry with a function of producing a magnetostatic bias on the warped free-layer along the direction of the Hall metal layer's current flow, for adding directionality to SOT switching events, comprising a single ferromagnetic layer; an antiferromagnetic layer with a warped geometry, disposed over the biasing fixed-layer to produce the pinning of the magnetization of the biasing fixed-layer and serve as a top electrode.

8. A perpendicular warped magnetic tunnel junction device, designed to be switched with a spin orbit torque mechanism or a combination of spin orbit torque and spin transfer torque mechanisms without the assistance of a biasing magnetic field for directional switching, comprising:

a Hall single metal layer or bi-layer of heavy metals with opposite spin Hall angle with warped geometry;

the warped free-layer of claim 1, disposed over the Hall single metal layer or bi-layer of heavy metals with opposite spin Hall angle;

a tunneling layer with warped geometry, disposed over the warped free-layer;

a fixed-layer with a warped geometry, comprising a single ferromagnetic layer or a plurality of ferromagnetic layers forming a synthetic anti-ferromagnetic structure, disposed over the tunneling layer;
a top electrode with a warped, bulging or dished geometry, disposed over the fixed-layer.

9. A perpendicular warped magnetic tunnel junction device, designed to be switched with a spin transfer torque mechanism, boosted by a spin orbit torque mechanism, comprising:
the warped free-layer of claim 1;
a Hall metal layer with warped geometry beneath the warped free-layer that is electrically connected to the bottom of the free-layer and to only one end of the Hall metal layer;
a tunneling layer with warped geometry, disposed over the warped free-layer;
a fixed-layer with a warped geometry, comprising a single ferromagnetic layer or a plurality of ferromagnetic layers forming a synthetic anti-ferromagnetic structure, disposed over the tunneling layer;
a top electrode with a warped, bulging or dished geometry, disposed over the fixed-layer.

10. A warped bit-patterned recording media comprising:
a substrate holding a pattern of bumps and dimples upon which magnetic bits are molded;
a seed layer with warped geometry, deposited over the substrate, that confers interface perpendicular magnetic anisotropy to magnetic bits;
a magnetic bit storage layer comprising an array of warped free-layer elements of claim 1, each one sitting on a warp mold patterned on the substrate;
a thin layer, deposited over the warped free-layer elements, with a function of providing interface perpendicular magnetic anisotropy to the magnetic bits;
a protective layer with warped geometry, disposed over the magnetic bits;
a continuous network of material that fills negative space between the magnetic bits and prevents exchange interaction between them;
a planarizing capping layer, disposed over the protective layer, with a function of protecting the magnetic bits from incidental contacts with a read/write-head.

* * * * *